(12) United States Patent
Wang et al.

(10) Patent No.: US 11,665,831 B2
(45) Date of Patent: May 30, 2023

(54) METHOD FOR MANUFACTURING A CIRCUIT BOARD WITH EMBEDDED NICKEL RESISTOR

(71) Applicants: HongQiSheng Precision Electronics (QinHuangDao) Co.,Ltd., Qinhuangdao (CN); Avary Holding (Shenzhen) Co., Limited., Shenzhen (CN)

(72) Inventors: Jian Wang, Qinhuangdao (CN); Mei Yang, Qinhuangdao (CN)

(73) Assignees: HongQiSheng Precision Electronics (QinHuangDao) Co., Ltd., Qinhuangdao (CN); Avary Holding (Shenzhen) Co., Limited., Shenzhen (CN)

( * ) Notice: Subject to any disclaimer, the term of this patent is extended or adjusted under 35 U.S.C. 154(b) by 276 days.

(21) Appl. No.: 17/027,932

(22) Filed: Sep. 22, 2020

(65) Prior Publication Data

US 2022/0071020 A1    Mar. 3, 2022

(30) Foreign Application Priority Data

Aug. 28, 2020   (CN) .......................... 202010888907.1

(51) Int. Cl.
| | | |
|---|---|---|
| H05K 3/30 | (2006.01) | |
| H05K 3/00 | (2006.01) | |
| H05K 3/24 | (2006.01) | |
| H05K 3/32 | (2006.01) | |

(52) U.S. Cl.
CPC ........... *H05K 3/305* (2013.01); *H05K 3/0017* (2013.01); *H05K 3/241* (2013.01); *H05K 3/321* (2013.01); *H05K 2201/10651* (2013.01)

(58) Field of Classification Search
CPC ...... H05K 3/305; H05K 3/0017; H05K 3/241; H05K 3/321; H05K 3/281; H05K 3/425; H05K 3/421; H05K 3/007; H05K 3/06; H05K 1/167; H05K 2203/1461; H05K 2201/0195; Y10T 29/49126; Y10T 29/49155
USPC .......................................... 29/830, 846, 852
See application file for complete search history.

(56) References Cited

U.S. PATENT DOCUMENTS

| | | | | |
|---|---|---|---|---|
| 5,243,320 A  * | 9/1993 | Clouser | ................. | H05K 1/167 338/308 |
| 6,631,551 B1 * | 10/2003 | Bowles | ................. | H05K 1/162 29/846 |
| 6,910,264 B2 * | 6/2005 | Tung | ..................... | H05K 1/162 29/830 |
| 7,441,329 B2 * | 10/2008 | Cheng | .................... | H05K 1/167 29/846 |

\* cited by examiner

*Primary Examiner* — Donghai D Nguyen
(74) *Attorney, Agent, or Firm* — ScienBiziP, P.C.

(57) ABSTRACT

A method for manufacturing a circuit board with nickel resistor embedded therein provides a copper substrate, the copper substrate includes a copper foil. A nickel resistance layer is formed on the copper foil. A first dielectric layer and a first copper layer are formed on the nickel resistance layer. The copper foil and the first copper layer are etched to form a first conductive wiring layer and a second conductive wiring layer respectively, the nickel layer not being subjected to an etching process, to obtain the finished circuit board.

7 Claims, 15 Drawing Sheets

METHOD FOR MANUFACTURING A CIRCUIT BOARD WITH EMBEDDED NICKEL RESISTOR

FIELD

The subject matter herein generally relates to printed circuit boards, and more particularly, to a circuit board and a method for manufacturing the circuit board.

BACKGROUND

Electronic devices, such as mobile phones, tablet computers, or personal digital assistants, may have more than one circuit board. Electronic components of the circuit board, such as resistors, may be embedded in the circuit board to increase the space utilization of the electronic device. To embed a nickel resistor in the circuit board, a nickel layer and a copper substrate are sequentially formed on a hard substrate, Then, a copper foil of the copper substrate and the nickel layer are etched by an etchant, thereby obtaining a conductive wiring layer and a nickel resistor, respectively.

However, since the etching solution first etches the copper foil and then the nickel layer, the nickel resistor may not have an even line width, causing a short circuit in the same nickel resistor line of the circuit board. Improvement in the art is desired.

BRIEF DESCRIPTION OF THE DRAWINGS

Implementations of the present technology will now be described, by way of embodiment, with reference to the attached figures.

DETAILED DESCRIPTION

Figure 1:
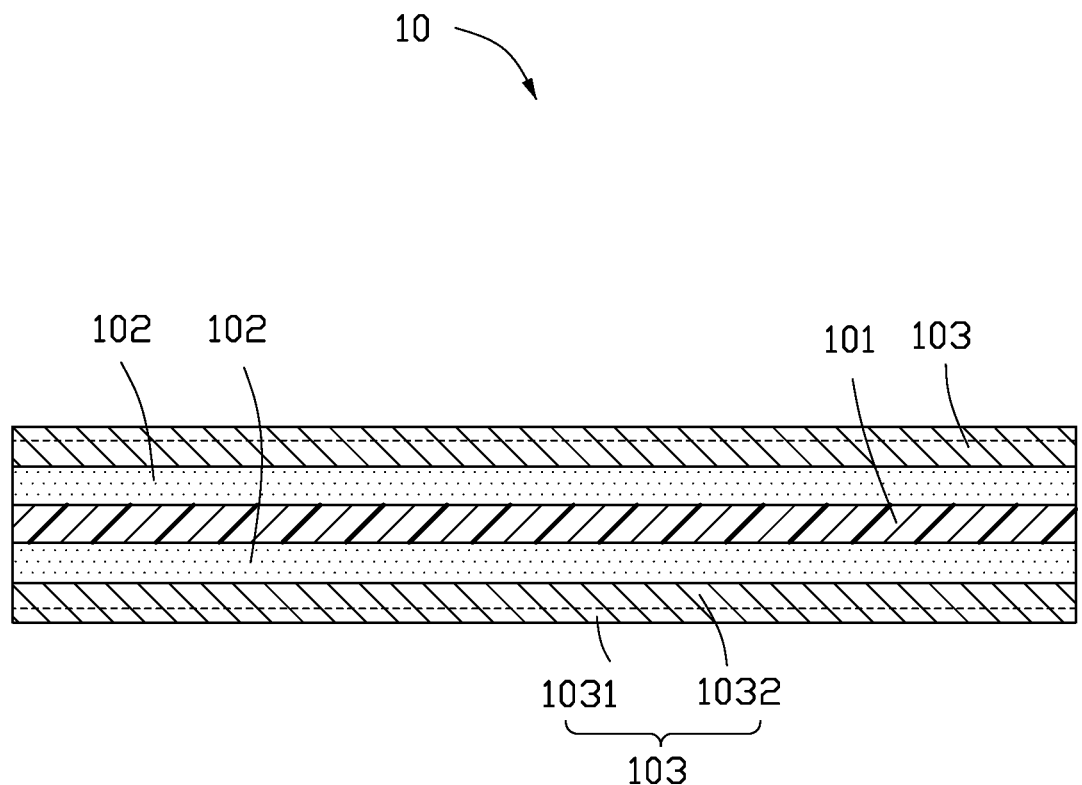
FIG. 1 is a diagrammatic view of an embodiment of a copper substrate.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Figure 15:
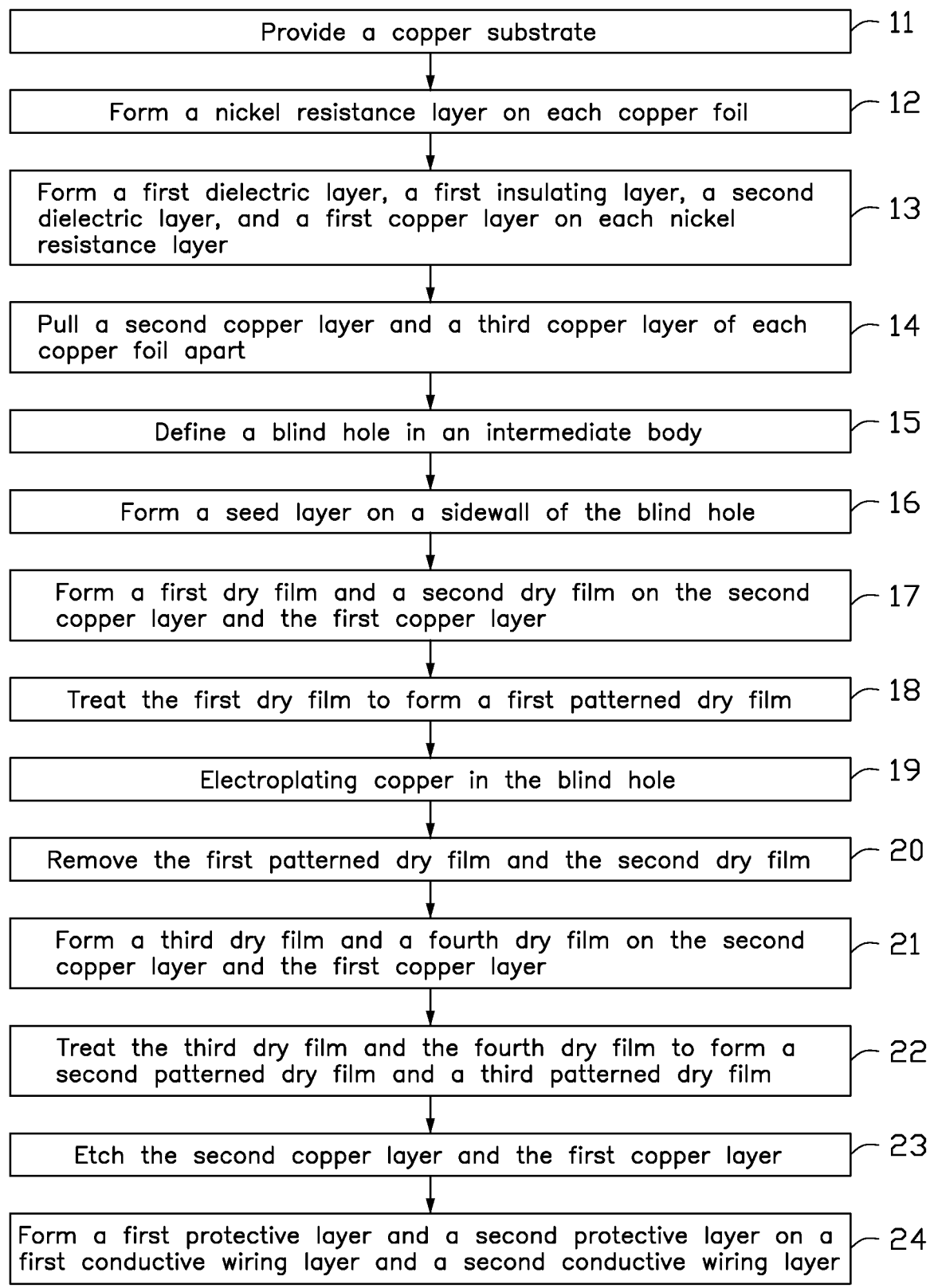
FIG. 15 is a flowchart of an embodiment of a method for manufacturing a circuit board.

Referring to FIG. 15, a method for manufacturing a circuit board is presented in accordance with an embodiment. The method is provided by way of example, as there are a variety of ways to carry out the method. The method may begin at block 11.

In block 11, referring to FIG. 1, a copper substrate 10 is provided.

In an embodiment, the first copper substrate 10 includes a base layer 101. The base layer 101 has two opposite surfaces. A first adhesive layer 102 and a copper foil 103 are disposed on each of the two surfaces of the base layer 101. The first adhesive layer 102 is sandwiched between the base layer 101 and the copper foil 103.

The base layer 101 may be a rigid substrate. The first adhesive layer 102 may be made of a material selected from a group consisting of epoxy resin, polypropylene (PP), BT resin, polyphenylene oxide (PPO), polypropylene (PP), polyimide (PI), polyethylene terephthalate (PET), and polyethylene naphthalate (PEN). In an embodiment, the first adhesive layer 102 is made of epoxy resin.

Each copper foil 103 includes a second copper layer 1031 (shown in FIG. 4) and a third copper layer 1032 connected to the second copper layer 1031. The second copper layer 1031 is disposed between the third copper layer 1032 and the first adhesive layer 102. The second copper layer 1031 and the third copper layer 1032 have different thicknesses. The second copper layer 1031 and the third copper layer 1032 can be pulled apart from each other.

Figure 2:
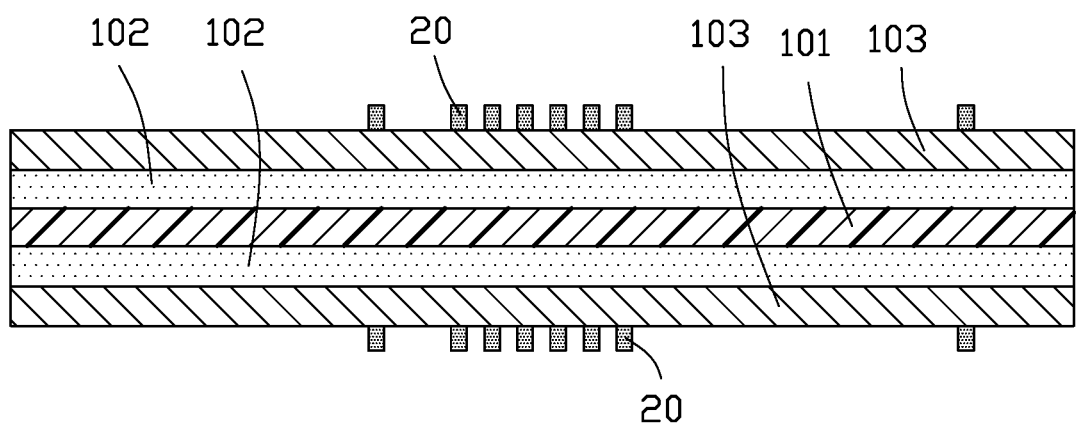
FIG. 2 is a diagrammatic view showing a nickel resistance layer formed on the copper foil of the copper substrate of FIG. 1.

In block 12, referring to FIG. 2, a nickel resistance layer 20 is formed on each copper foil 103.

The nickel resistance layer 20 may be formed by an additive method. The nickel resistance layer 20 can also be formed by chemically depositing a nickel layer on the copper foil 103 and then etching the nickel layer.

Figure 3:
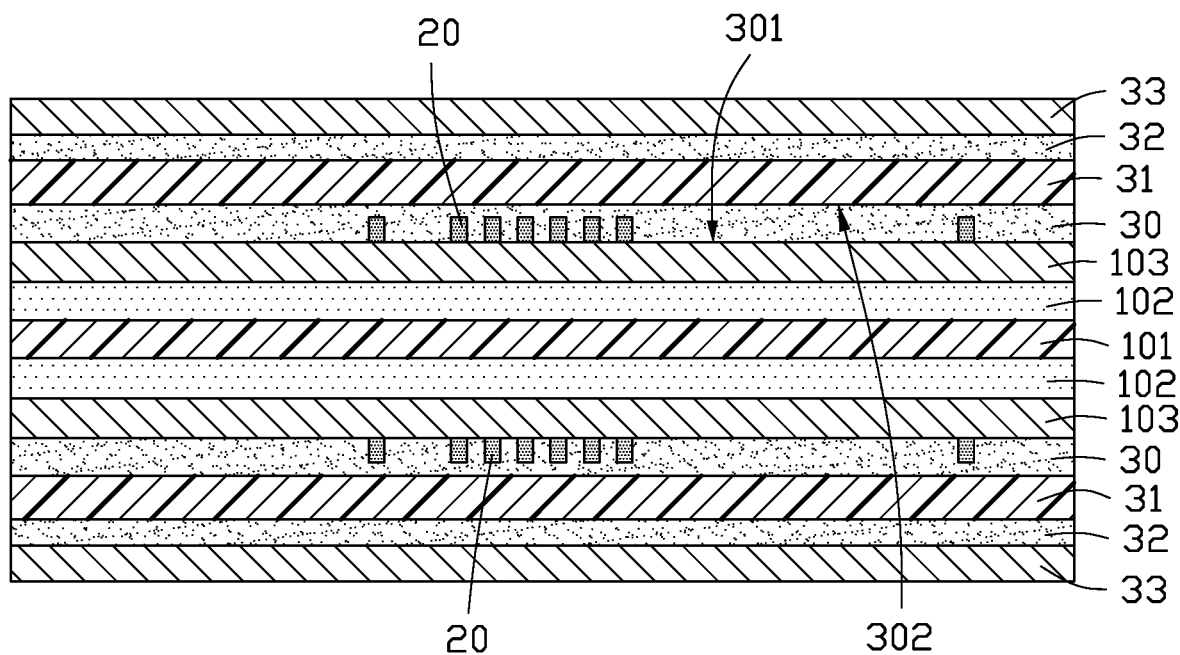
FIG. 3 is a diagrammatic view showing a first dielectric layer, a first insulating layer, a second dielectric layer, and a first copper layer sequentially formed on each nickel resistance layer of FIG. 2.

In block 13, referring to FIG. 3, a first dielectric layer 30, a first insulating layer 31, a second dielectric layer 32, and a first copper layer 33 are sequentially formed on each nickel resistance layer 20.

The first dielectric layer 30 is made of a soft material. After pressing the first dielectric layer 30, the nickel resistance layer 20 is embedded in the first dielectric layer 30. In an embodiment, the first dielectric layer 30 includes a first surface 301 facing the base layer 101 and a second surface 302 opposite to the first surface 301. The first surface 301 is recessed to form a plurality of grooves. The nickel resistance layer 20 is disposed in the grooves.

The first dielectric layer 30, the first insulating layer 31, and the second dielectric layer 32 may be made of a material selected from a group consisting of epoxy resin, polypropylene, BT resin, polyphenylene oxide, polypropylene, polyimide, polyethylene terephthalate, polyethylene naphthalate, and thermoplastic polyimide (TPI). In an embodiment, the first dielectric layer 30 and the second dielectric layer 32 are both made of thermoplastic polyimide. The first insulating layer 31 is made of polyimide.

Figure 4:
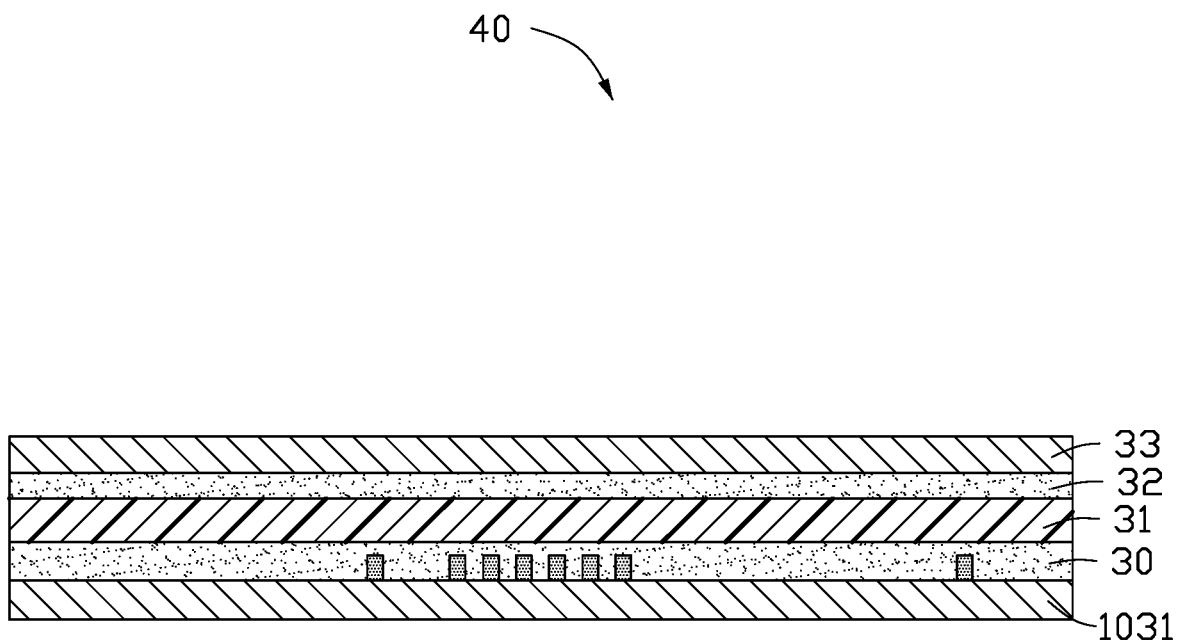
FIG. 4 is a diagrammatic view showing each copper foil of FIG. 3 separated to form an intermediate body.

In block 14, referring to FIG. 4, the second copper layer 1031 and the third copper layer 1032 of each copper foil 103 are pulled apart to obtain two intermediate bodies 40 (FIG. 4 only shows one intermediate body 40).

Each intermediate body 40 includes the second copper layer 1031, the first dielectric layer 30, the first insulating layer 31, the second dielectric layer 32, and the first copper layer 33. The nickel resistance layer 20 is embedded in the first dielectric layer 30.

In an embodiment, adhesiveness between the first adhesive layer 102 and the third copper layer 1032 is greater than adhesiveness between the second copper layer 1031 and the third copper layer 1032. Thus, the second copper layer 1031 may be pulled away from the third copper layer leaving the third copper layer 1032 still bonded to the first adhesive layer 102.

Figure 5:
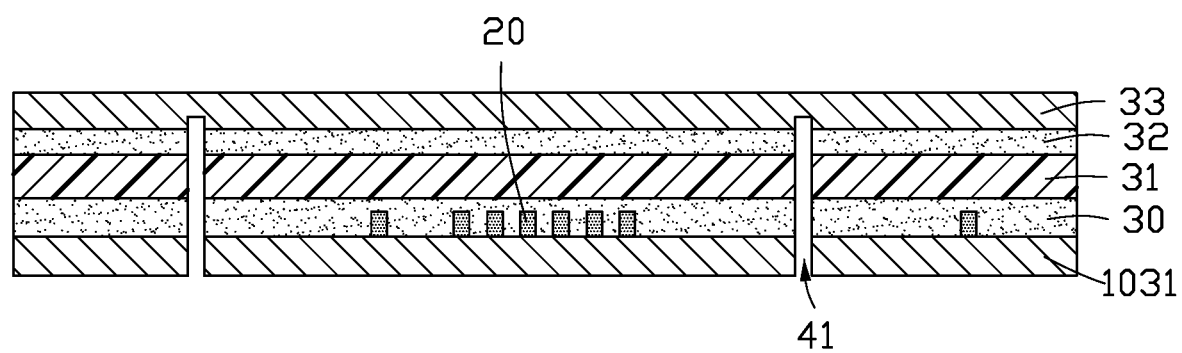
FIG. 5 is a diagrammatic view showing a blind hole defined in the intermediate body of FIG. 4.

In block 15, referring to FIG. 5, a blind hole 41 is defined in the intermediate body 40. The blind hole 41 penetrates the second copper layer 1031, the first dielectric layer 30, the first insulating layer 31, the second dielectric layer 32, and a portion of the first copper layer 33. The first copper layer 33 is at the bottom of the blind hole 41.

Figure 6:
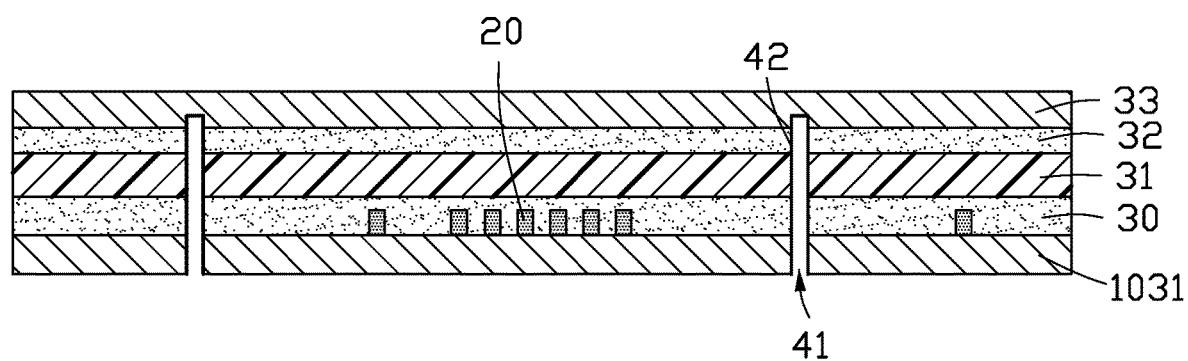
FIG. 6 is a diagrammatic view showing a seed layer formed on sidewall of the blind hole of FIG. 5.

In block 16, referring to FIG. 6, a seed layer 42 is formed on a sidewall of the blind hole 41.

In an embodiment, the seed layer 42 may be formed by a shadow process. The conductive layer 42 may also be formed by chemical plating of gold or nickel on the sidewall of the blind hole 41. The seed layer 42 facilitates the subsequent copper electroplating process on the sidewall of the blind hole 41.

Figure 7:
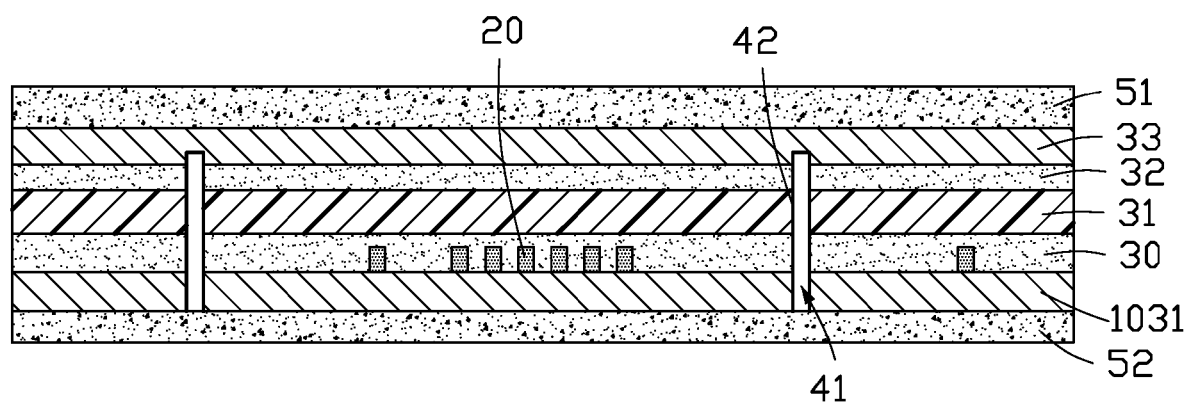
FIG. 7 is a diagrammatic view showing a first dry film and a second dry film respectively formed on the second copper layer and the first copper layer of FIG. 6.

In block 17, referring to FIG. 7, a first dry film 50 and a second dry film 51 are formed on the second copper layer 1031 and the first copper layer 33 respectively.

Figure 8:
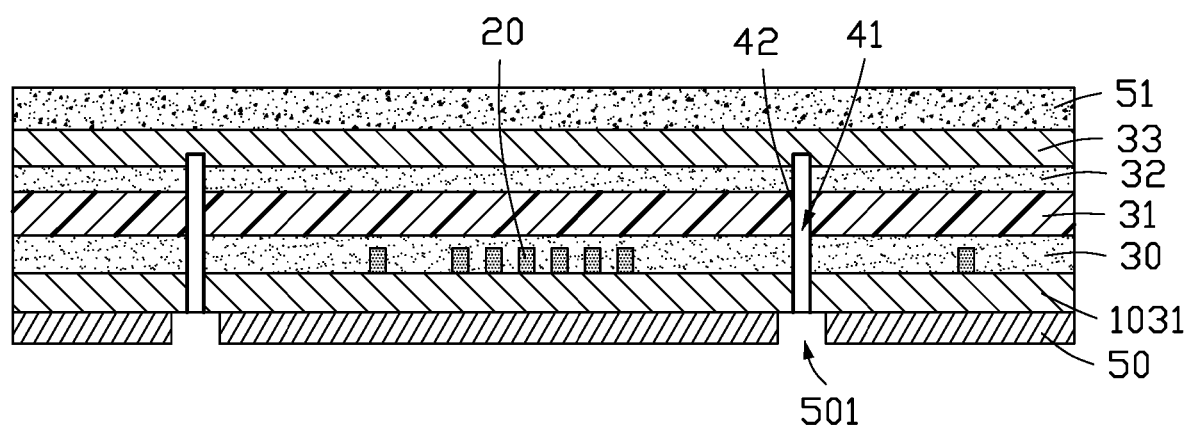
FIG. 8 is a diagrammatic view showing the first dry film of FIG. 7 treated by an exposure and development process, to obtain a first patterned dry film.

In block S18, referring to FIG. 8, the first dry film 50 is treated by an exposure and development process to form a first patterned dry film 50. The first patterned dry film 50 includes patterned openings 501 exposing the blind hole 41.

Figure 9:
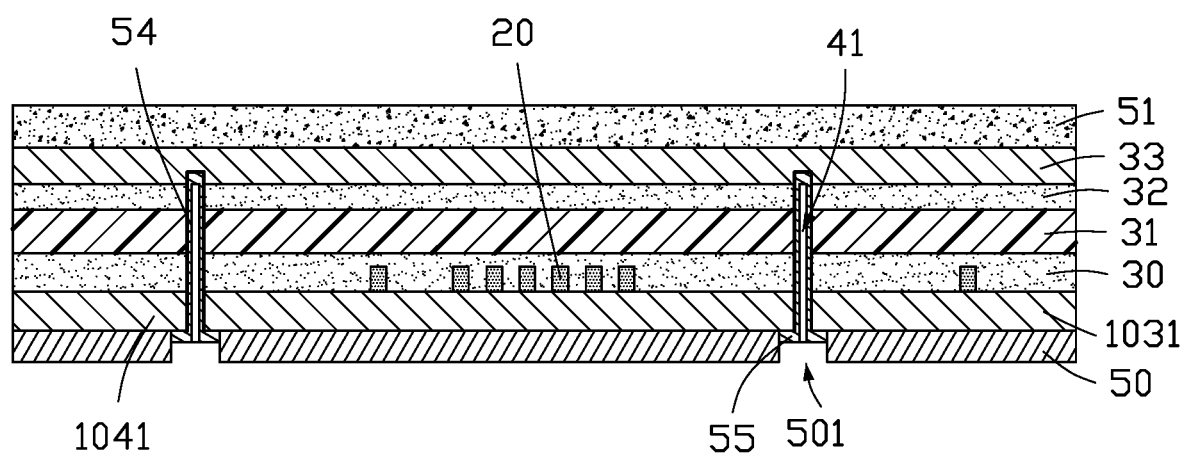
FIG. 9 is a diagrammatic view showing copper electroplating in the blind hole of FIG. 8.

In block 19, referring to FIG. 9, copper is electroplated in the blind hole 41 having the seed layer 42, thereby obtaining a conductive via 54.

In an embodiment, the second copper layer 1031 includes a region 10311 surrounding the blind hole 41. The region 10311 is exposed from the patterned openings 501. The electroplated copper is also formed on the region 10311, creating an annular ring 55 connecting the conductive via 54.

Since the second dry film 51 covers the first copper layer 33, no copper is electroplated onto the first copper layer 33.

Figure 10:
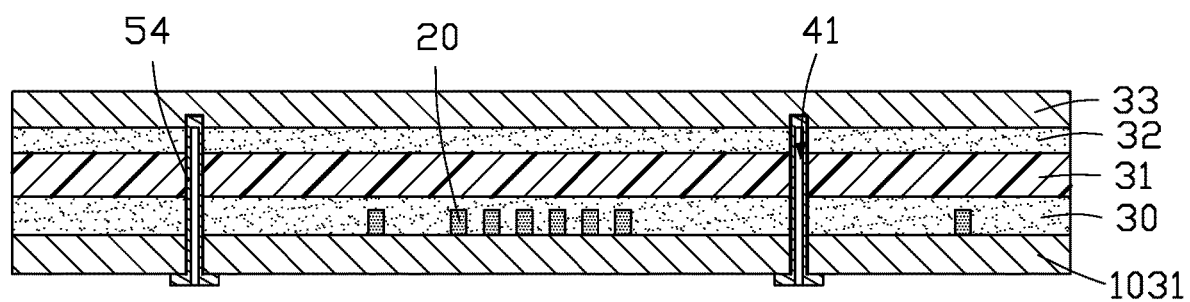
FIG. 10 is a diagrammatic view showing the first patterned dry film and the second dry film of FIG. 9 removed.

In block 20, referring to FIG. 10, the first patterned dry film 50 and the second dry film 51 are removed.

Figure 11:
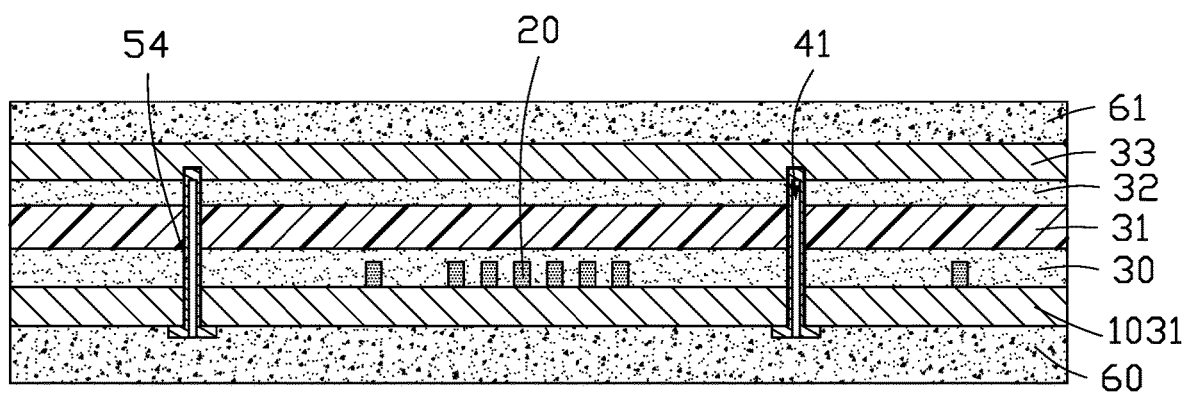
FIG. 11 is a diagrammatic view of the structure after forming a third dry film and a fourth dry film on the second copper layer and the first copper layer of FIG. 10 respectively.

In block 21, referring to FIG. 11, a third dry film 60 and a fourth dry film 61 are formed on the second copper layer 1031 and the first copper layer 33 respectively.

Figure 12:
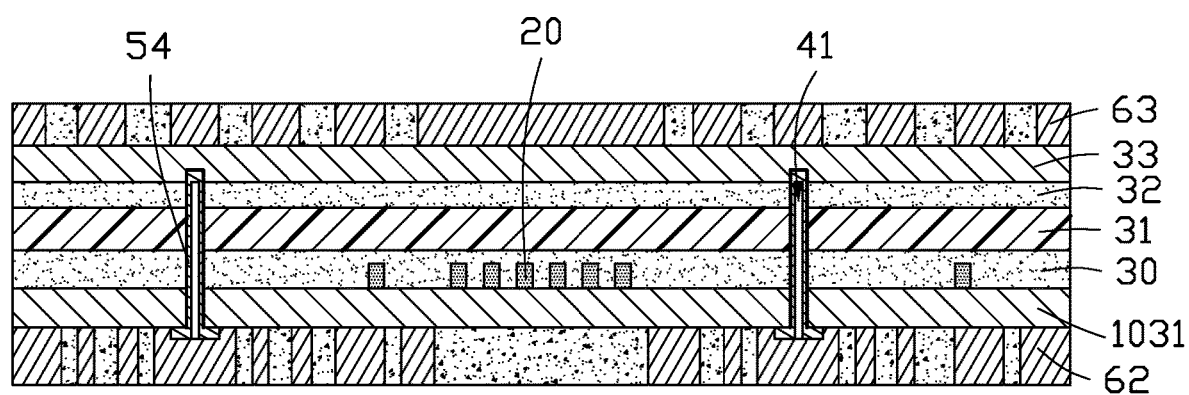
FIG. 12 is a diagrammatic view showing the third dry film and the fourth dry film of FIG. 11 treated by an exposure and development process, to obtain third and fourth patterned dry films.

In block 22, referring to FIG. 12, the third dry film 60 and the fourth dry film 61 are treated by an exposure and development process, to form a second patterned dry film 62 and a third patterned dry film 63.

Figure 13:
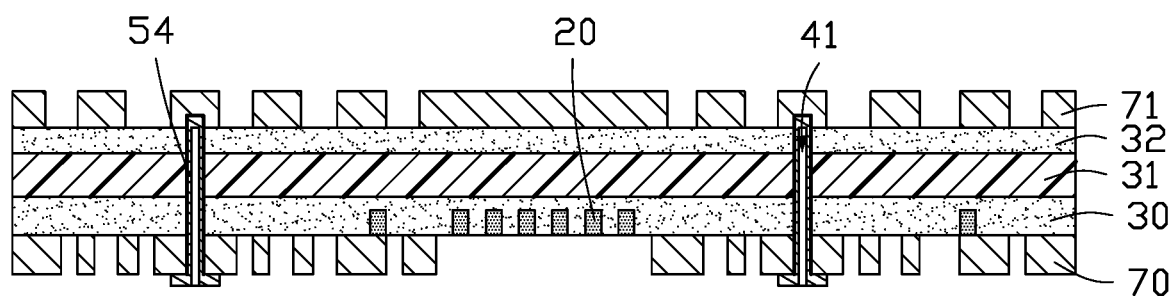
FIG. 13 is a diagrammatic view showing the second copper layer and the first copper layer of FIG. 12 etched, and the second patterned dry film and the third patterned dry film removed.

In block 23, referring to FIG. 13, the second copper layer 1031 and the first copper layer 33 are etched through the second patterned dry film 62 and the third patterned dry film 63, thereby obtaining a first conductive wiring layer 70 and a second conductive wiring layer 71. The second patterned dry film 62 and the third patterned dry film 63 are then removed.

The second conductive wiring layer 71 is electrically connected to the first conductive wiring layer 70 through the conductive via 54, so that the second conductive wiring layer 71 is also electrically connected to the nickel resistance layer 20.

Figure 14:
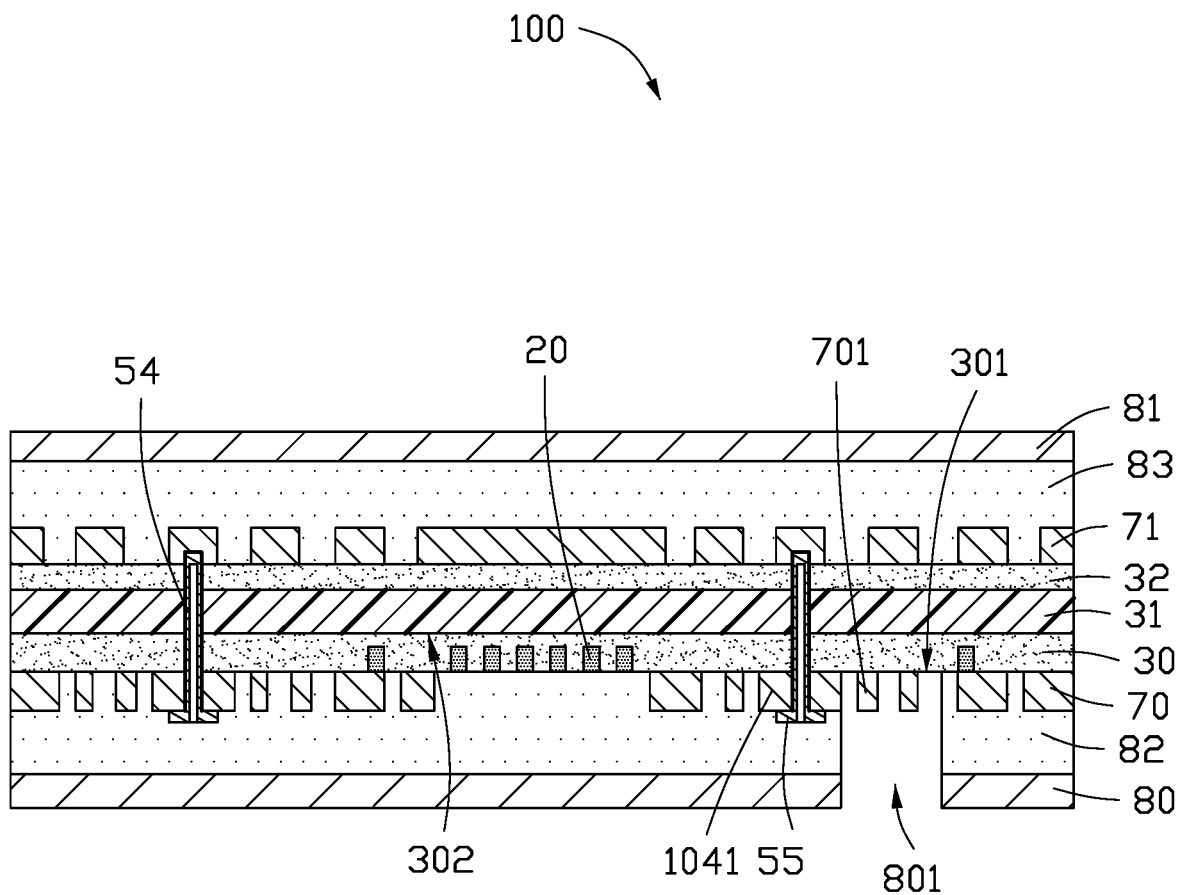
FIG. 14 is a diagrammatic view showing a first protective layer and a second protective layer formed on the first conductive wiring layer and the second conductive wiring layer of FIG. 13, to obtain a finished circuit board.

In block 24, referring to FIG. 14, a first protective layer 80 and a second protective layer 81 are formed on the first conductive wiring layer 70 and the second conductive wiring layer 71 respectively, to obtain the circuit board 100.

In an embodiment, a second adhesive layer 82 is disposed between the first protective layer 80 and the first conductive wiring layer 70. A third adhesive layer 70 is disposed between the second protective layer 81 and the second conductive wiring layer 70. Both the first protective layer 80 and the second protective layer 81 may be solder mask layers or cover layers (CVL).

The first protection layer 80 includes an opening 801 exposing a portion of the first conductive wiring layer 70. The exposed portion of the first conductive wiring layer 70 forms a pad 701. The pad 701 is for mounting an electronic component (not shown).

FIG. 14 illustrates an embodiment of a circuit board 100, including a first insulating layer 31. The circuit board 100 further includes a first dielectric layer 30, a first conductive wiring layer 70, and a first protective layer 80 sequentially disposed on a surface of the first insulating layer 31. A nickel resistance layer 20 is embedded in the first dielectric layer 30. The circuit board 100 further includes a second dielectric layer 32, a second conductive wiring layer 71, and a second protection layer 81 sequentially disposed on an opposite surface of the first insulating layer 31.

In an embodiment, the first dielectric layer 30 includes a first surface 301 away from the first insulating layer 31 and a second surface 302 facing the first insulating layer 31. The first surface 301 is recessed to form a plurality of grooves. The nickel resistance layer 20 is disposed in the grooves.

A blind hole 41 penetrating the first conductive wiring layer 70, the first dielectric layer 30, the first insulating layer 31, the second dielectric layer 32, and a portion of the second conductive wiring layer 71 is defined in the circuit board 100. The second conductive wiring layer 71 is at the bottom of the blind hole 41. A conductive via 54 is disposed in the blind hole 41, which electrically connects the first conductive wiring layer 70 to the second conductive wiring layer 71. In an embodiment, the first conductive wiring layer 70 includes a region 10311 surrounding the conductive via 54. An annular ring 55 connecting the conductive via 54 is disposed on the region 10311.

In an embodiment, a second adhesive layer 82 is disposed between the first protective layer 80 and the first conductive wiring layer 70. A third adhesive layer 70 is disposed between the second protective layer 81 and the second conductive wiring layer 70.

Since the nickel resistance layer 20 is formed before the first copper layer 33 is etched, the nickel resistance layer 20 is not subjected to an etching process. Thus, the process of etching the copper foil first and then the nickel layer avoid the uneven line width of the nickel resistance layer 20 and short circuit in the nickel resistance layer 20. Further, the nickel resistance layer 20 is embedded in the first dielectric layer 30, which reduce the possibility of short circuit in the nickel resistance layer 20.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A method for manufacturing a circuit board, comprising:
   providing a copper substrate, the copper substrate comprising a base layer and two copper foils disposed on two opposite surfaces of the base layer, wherein each copper foil comprises a second copper layer and a third copper layer connected to the second copper layer;
   forming a nickel resistance layer on the copper foil;
   forming a first dielectric layer and a first copper layer on the nickel resistance layer, the first dielectric layer sandwiched between the first copper layer and the nickel resistance layer;
   separating the second copper layer and the third copper layer of each copper foil from each other, thereby obtaining two intermediate bodies, each intermediate body comprising the second copper layer, the nickel resistance layer, the first dielectric layer, and the first copper layer; and
   etching the second copper layer and the first copper layer to form a first conductive wiring layer and a second conductive wiring layer, respectively, thereby obtaining the circuit board.

2. The method of claim 1, wherein the nickel resistance layer is embedded in the first dielectric layer.

3. The method of claim 1, further comprising:
   defining a blind hole in the intermediate body, the blind hole penetrating the second copper layer and the first dielectric layer, the first copper layer being at a bottom of the blind hole; and
   electroplating copper on a sidewall of the blind hole to form a conductive via, the conductive via electrically connecting the first conductive wiring layer to the second conductive wiring layer.

4. The method of claim 3, wherein before electroplating copper on the sidewall of the blind hole, the method further comprises:
   forming a seed layer on the sidewall of the blind hole, wherein the copper is electroplated on the seed layer.

5. The method of claim 1, wherein a first adhesive layer is disposed between each copper foil and the base layer, adhesiveness between the first adhesive layer and the third copper layer is greater than adhesiveness between the second copper layer and the third copper layer.

6. The method of claim 1, wherein the second copper layer and the third copper layer have different thickness.

7. The method of claim 1, further comprising:
   forming a first protective layer on the first conductive wiring layer, the first protective layer comprising an opening, and a portion of the first conductive wiring layer exposed from the opening to form a pad; and
   forming a second protective layer on the second conductive wiring layer.

\* \* \* \* \*